United States Patent
Morris (10) Patent No.: US 11,360,874 B2
(45) Date of Patent: Jun. 14, 2022

(54) REGISTERING CLOCK DRIVER CONTROLLED DECISION FEEDBACK EQUALIZER TRAINING PROCESS

(71) Applicant: Intel Corporation, Santa Clara, CA (US)

(72) Inventor: Tonia G. Morris, Wendell, NC (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/919,649

(22) Filed: Jul. 2, 2020

(65) Prior Publication Data

US 2020/0334121 A1   Oct. 22, 2020

Related U.S. Application Data

(63) Continuation of application No. 15/716,460, filed on Sep. 26, 2017, now abandoned.

(51) Int. Cl.
*G11C 7/22* (2006.01)
*G06F 11/34* (2006.01)
*G06F 11/30* (2006.01)
*G11C 29/02* (2006.01)

(52) U.S. Cl.
CPC ...... *G06F 11/3409* (2013.01); *G06F 11/3037* (2013.01); *G11C 29/021* (2013.01); *G11C 29/028* (2013.01)

(58) Field of Classification Search
CPC .................................................. G11C 11/4063

USPC .......................................................... 375/233
See application file for complete search history.

(56) References Cited

U.S. PATENT DOCUMENTS

| | | | |
|---|---|---|---|
| 6,842,495 B1 | 1/2005 | Jaffe et al. | |
| 7,586,983 B1* | 9/2009 | Shumarayev | ..... H04L 25/03057 375/233 |
| 9,021,154 B2 | 4/2015 | Morris et al. | |
| 9,215,104 B1* | 12/2015 | Vita | .................. H04L 25/03057 |
| 9,542,991 B1* | 1/2017 | Xie | ....................... G11C 7/1072 |
| 9,583,155 B1 | 2/2017 | Xie et al. | |
| 9,589,626 B1 | 3/2017 | Liu et al. | |
| 9,627,029 B2 | 4/2017 | Morris et al. | |
| 10,148,416 B2 | 12/2018 | Morris et al. | |
| 10,416,912 B2 | 9/2019 | Morris et al. | |
| 2006/0083296 A1 | 4/2006 | Bhattacharjee et al. | |
| 2010/0309736 A1 | 12/2010 | Russell et al. | |
| 2010/0327924 A1 | 12/2010 | Hasegawa et al. | |
| 2011/0299583 A1 | 12/2011 | Yamaguchi et al. | |
| 2011/0311009 A1 | 12/2011 | Flynn et al. | |
| 2013/0064281 A1 | 3/2013 | Raphael et al. | |
| 2016/0308694 A1* | 10/2016 | Hoang | ..................... H04B 1/16 |

(Continued)

*Primary Examiner* — Min Huang
(74) *Attorney, Agent, or Firm* — Compass IP Law PC (57) ABSTRACT

A method is described. The method includes receiving from a memory controller configuration information for a testing sequence and storing the configuration information in configuration register space of the driver circuit. The method also includes controlling the next testing sequence. The testing sequence includes sweeping values of a tap coefficient of a DFE circuit of the driver circuit and sweeping a voltage of a slicer of the driver circuit. The method includes sending results of the testing sequence to the memory controller. The results are to determine a value for the DFE tap coefficient.

7 Claims, 9 Drawing Sheets

(56) References Cited

U.S. PATENT DOCUMENTS

| | | | |
|---|---|---|---|
| 2018/0114564 A1* | 4/2018 | DeSimone | G11C 7/1093 |
| 2018/0188959 A1* | 7/2018 | Thakkar | G11C 11/4072 |

* cited by examiner

Fig. 9

REGISTERING CLOCK DRIVER CONTROLLED DECISION FEEDBACK EQUALIZER TRAINING PROCESS

RELATED CASES

This application is a continuation of and claims the benefit of U.S. patent application Ser. No. 15/716,460, entitled, "REGISTERING CLOCK DRIVER CONTROLLED DECISION FEEDBACK EQUALIZER TRAINING PROCESS", filed Sep. 26, 2017, which is incorporated by reference in its entirety.

FIELD OF INVENTION

The field of invention pertains generally to computing systems, and, more specifically, to a registering clock driver controlled decision feedback equalizer training process.

BACKGROUND

The performance of a computing system is heavily dependent on the computing system's system memory (also referred to as main memory). As such, system designers are highly motivated to improve the performance of system memory. However improving the performance of system memory can entail the inclusion of sensitive circuits that require training and configuration. Reducing the overhead of the training and configuration is a design goal otherwise, e.g., too much time will be spent waiting for the memory system to be operable.

FIGURES

A better understanding of the present invention can be obtained from the following detailed description in conjunction with the following drawings, in which.

DETAILED DESCRIPTION

Figure 1:
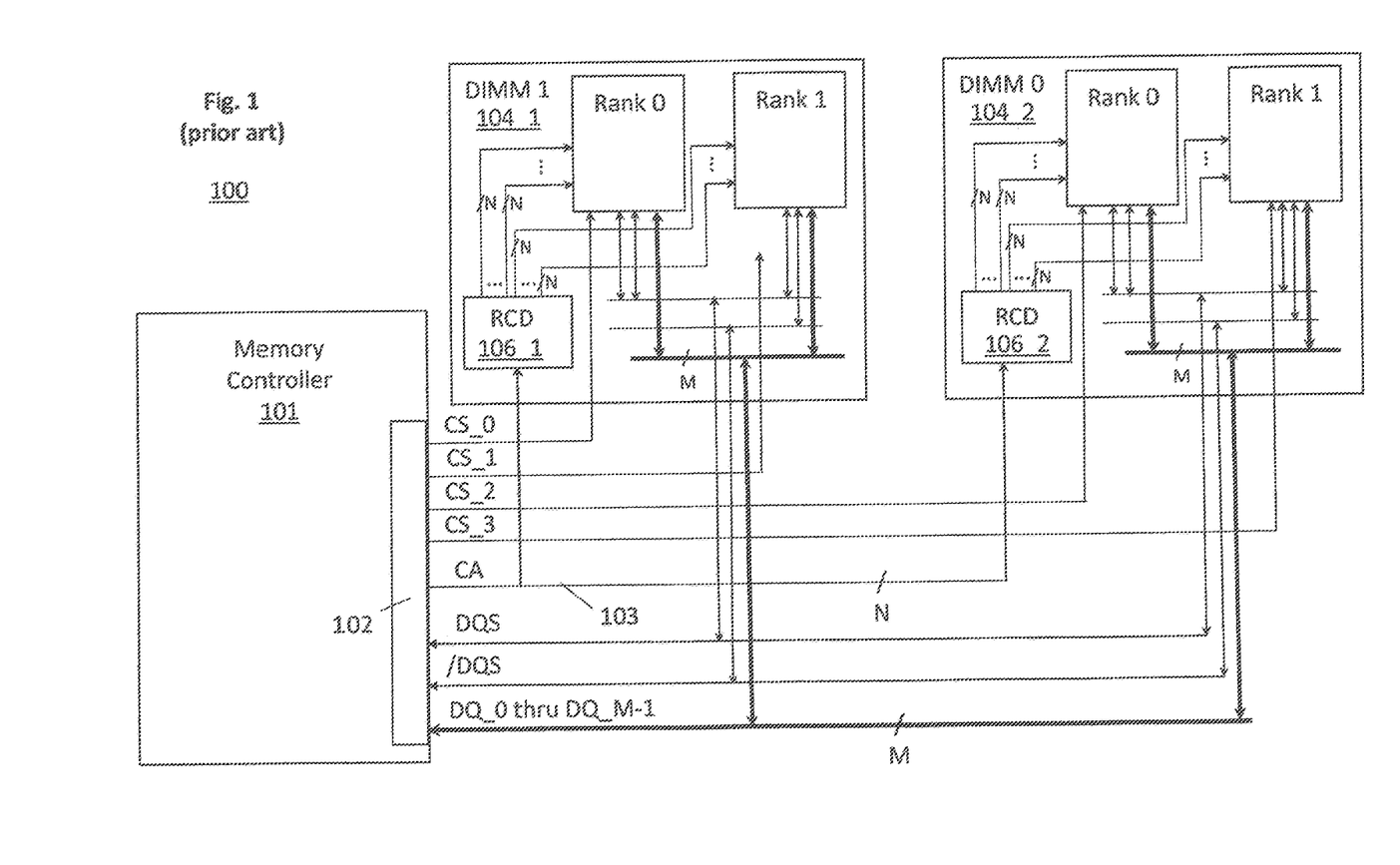
FIG. 1 shows a memory system.

FIG. 1 shows a schematic diagram of a system memory implementation 100. As observed in FIG. 1, the system memory implementation includes a memory controller 101 on the host side. The memory controller 101 includes a double data rate (DDR) memory bus interface 102 that is coupled to the wiring of a DDR memory bus this is disposed, e.g., on the motherboard of a computing system.

A pair of dual in line memory modules 104_1, 104_2 are coupled to the memory bus. The memory bus includes N control signal wires (where N is an integer) that together are referred to as the Command Address "CA" bus 103. The control signals that are carried on the CA bus 103 include, to name a few, a row address strobe signal (RAS), column address strobe signal (CAS), a write enable (WE) signal and a plurality of address (ADDR) signals.

As observed in FIG. 1, the control signals 103 are intercepted by a registering clock driver (RCD) circuit 106_1, 106_2 on each of the DIMMs 104_1, 104_2. For ease of illustration, FIG. 1 indicates that the chip select (CS) signals are not intercepted by the RCD circuits of the respective DIMM card that they are directed to. However, in various implementations, the RCD circuits receive and redrive the CS signals of their respective DIMM card.

Figure 2:
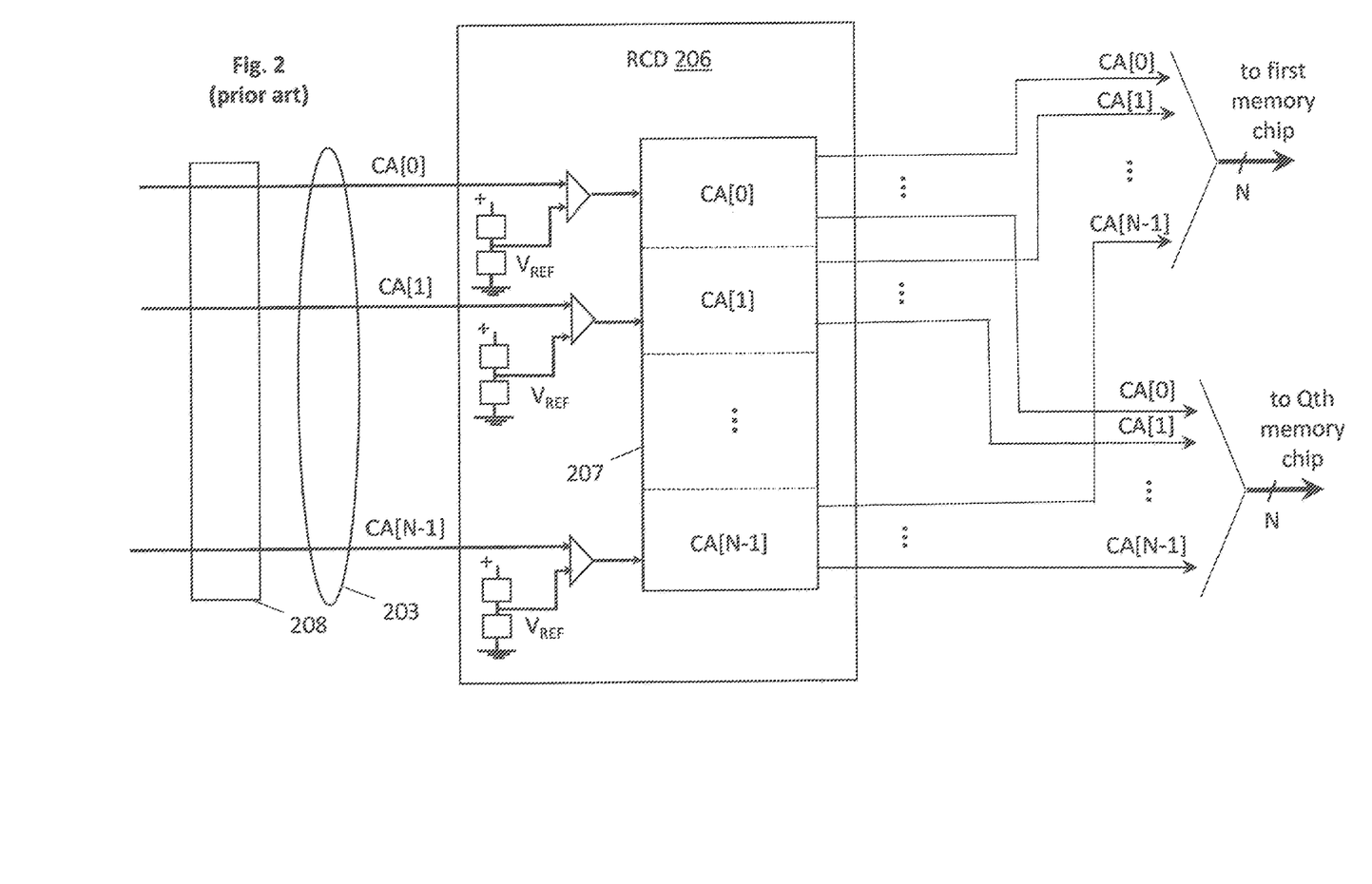
FIG. 2 shows a registering clock driver circuit.

FIG. 2 shows a more detailed view of an RCD circuit 206. As observed in FIG. 2, the RCD circuit 206 includes redriver circuitry 207 to redrive the N CA control signals on the CA bus 203 to multiple loads on the DIMM (specifically, the Q different memory chips on the DIMM where each rank on the DIMM includes Q/2 memory chips). The RCD circuit 206 may be characterized as a form of driver circuit because of its signal driving function. Here, the control signals that are transported on the CA bus 203 are high speed signals that might otherwise suffer debilitating distortion without the help of the RCD circuit 206. That is, as the control signals propagate through the connector 208 that connects the DIMM to the motherboard, they may suffer various forms of signal distortion such as loss of high frequency components and varied delay/skew.

The RCD circuit 206 essentially samples these signals as they emerge through the connector 208 and the redrive circuitry 207 redrives fresh, "cleaner" digital pulses to the Q memory chips 209 on the DIMM 204. Additionally, as can be seen from FIG. 2, the RCD circuit 206 also provides a single point of termination for each of the control signals after they emerge from the connector 208. The single point of termination essentially eliminates any further corruption of these signals that would otherwise occur if each control signal were to continue to propagate to the multiple Q loads that each of the memory chips on the DIMM impose.

As is known in the art, adequately driving multiple loads is more difficult to achieve, particularly for high speed signals. As such, the RCD circuit 206 removes this challenge from the signals that emerge directly from the connector 208 by terminating them with only a single load at the front end of the RCD circuit 206 (which is not depicted in FIG. 2 for illustrative ease) and redriving these same signals with the redrive circuitry 207 to each of the Q multiple loads. The redrive circuitry 207 may be composed, e.g., of registers that latch the control signals in parallel and then redrives them on a following clock edge so as to remove any skew that may have been present across the set of incoming signals that were sampled.

With the development of even higher speed system memory bus technologies, future RCD circuits will need to include sophisticated receiving circuitry (rather than just a traditional termination) at the front end of the RCD circuit in order to ensure that the control signals are properly received.

Figure 3:
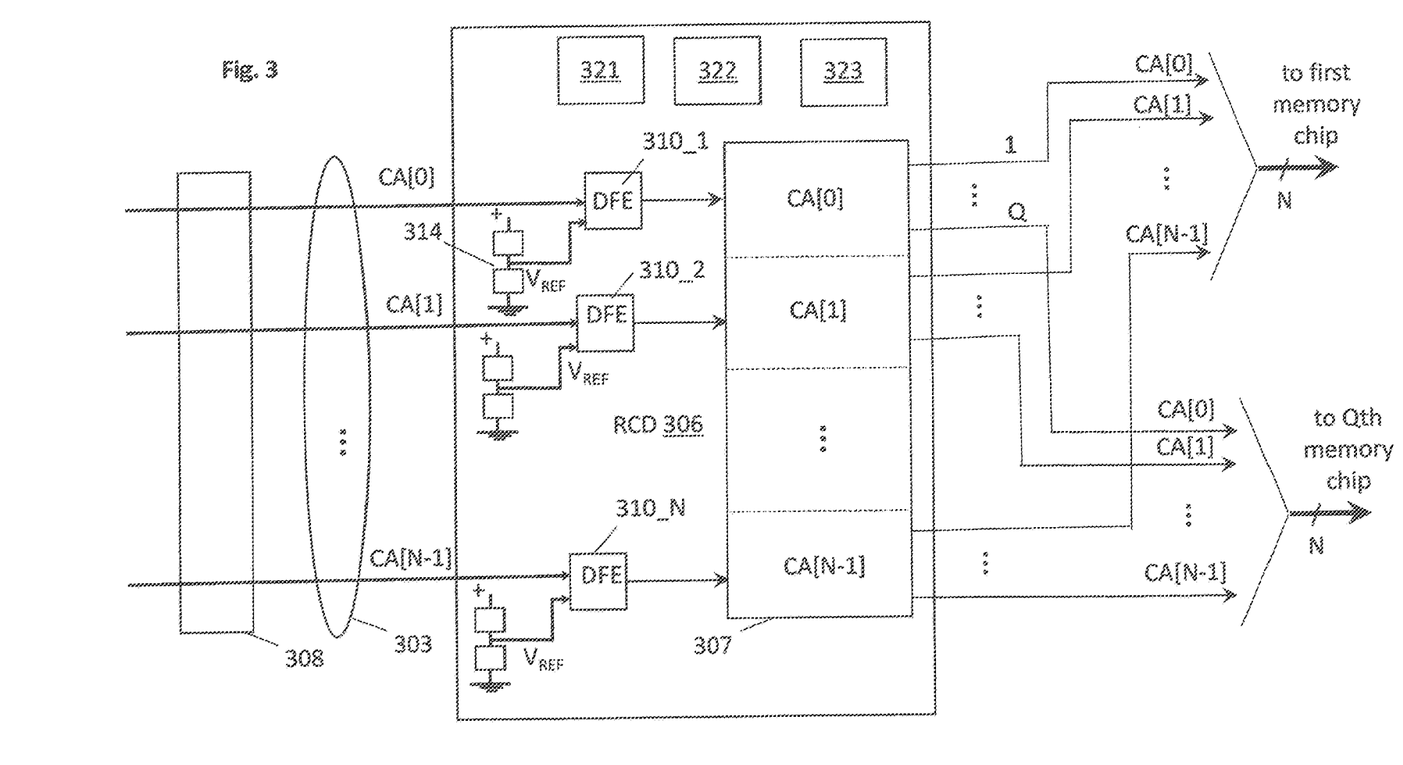
FIG. 3 shows an improved registering clock driver circuit.

FIG. 3 shows one approach in which a decision feedback equalizer (DFE) circuit 310_1 through 310_N is placed at the front end of the RCD circuit 306 along each incoming high speed control signal path in order to properly determine the digital information stream of each signal before it is presented to the redrive circuitry 307.

Figure 4:
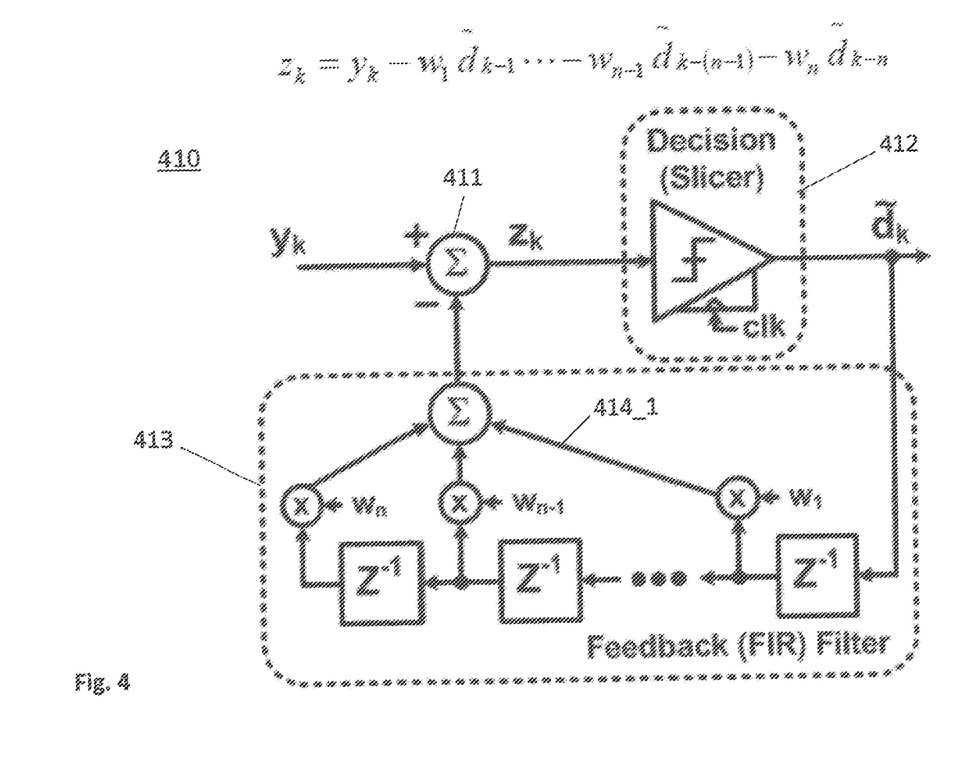
FIG. 4 shows a decision feedback equalizer (DFE) receiver circuit.

FIG. 4 shows an embodiment of a decision feedback equalizer (DFE) circuit 410. As observed in FIG. 4, a DFE circuit 410 includes a summation circuit 411 at its front end, a decision slicer circuit 412 at its back end and a feedback path 413 that includes multiple taps for each of multiple previously sampled digital bit values. A DFE circuit 410 is a circuit that is very well suited to remove inter symbol interference (ISI) which is a highly problematic form of distortion for high speed digital signal streams. Very high speed digital pulses tend to lose their sharp rectangular shape as they propagate along a signal trace resulting in more drawn out, wider, rounder shapes by the time they are received at the receiving end. The wider rounded pulses can extend into the time slot of neighboring pulses. The pulse shape of any pulse can therefore become even more corrupted by the interfering waveforms of its neighboring pulses in the digital stream.

DFE circuits are circuits that are well suited to remove this specific kind of distortion because each "tap" in the feedback path 413 can be specially tuned to remove the interference from a particular pulse that has preceded (was received ahead of) the current pulse whose digital value is presently being determined.

Here, the decision slicer 412 determines the digital value (1 or 0) of the digital pulse that is currently being received. A first feedback path 414_1 that flows from a first tap along the feedback path 413 includes a first coefficient $W_1$ that is specially configured to remove any interference from the digital pulse that immediately preceded the digital pulse that is currently being received. Here, the coefficient $W_1$ attempts to capture the amplitude (or amount) of the immediately prior pulse that interferes with the current pulse and the summation circuit 411 then subtracts this particular amplitude from the currently received signal. The subtraction ideally completely removes any/all interference from the immediately prior pulse with the pulse that is currently being received.

Other feedback paths from the other taps along the feedback path behave similarly except their coefficients are tuned for different, respective earlier received pulses (path n−1 ideally removes interference from the pulse that was received n−1 time slots ahead of the current pulse; path n ideally removes interference from the pulse that was received n time slots ahead of the current pulse). Thus, the DFE circuit 410 of FIG. 4 is designed to remove any interference from the n pulses that were received ahead of the current pulse. The remaining discussion assumes a DFE that is designed to remove ISI from the four preceding pulses (n=4). However, removal of interference from four preceding pulses is only exemplary (other DFE implementations may be designed to remove the interference from more or less than four preceding pulses).

Referring back to the improved RCD circuit 306 of FIG. 3 which includes a DFE circuit 310_1 through 310_N along the path of each incoming high speed CA control signal, a potential problem is the amount of time that will be consuming determining the appropriate coefficient value $W_i$ for each tap of each feedback path of every DFE circuit. Here, the amount of ISI that a particular pulse will receive is highly dependent on its specific channel. As such, the tap coefficient settings for each of the DFE circuits are apt to different (each DFE circuit may have its own unique set of tap coefficient settings).

The appropriate tap coefficient settings are determined, e.g., during system boot-up with a series of test patterns that are propagated through each high speed CA control signal trace. Training circuitry then analyzes the DFE's behavior in response to the patterns and determines appropriate tap coefficient settings for the DFE. A more detailed discussion of a specific training embodiment is provided in more detail further below.

The improved RCD also includes a training controller 321, training configuration space 322 and DFE coefficient register space 323. The training controller 321 performs various tasks to support the training routine that determines the correct tap coefficients for each of the DFE circuits 310_1 through 310_N.

Figure 5:
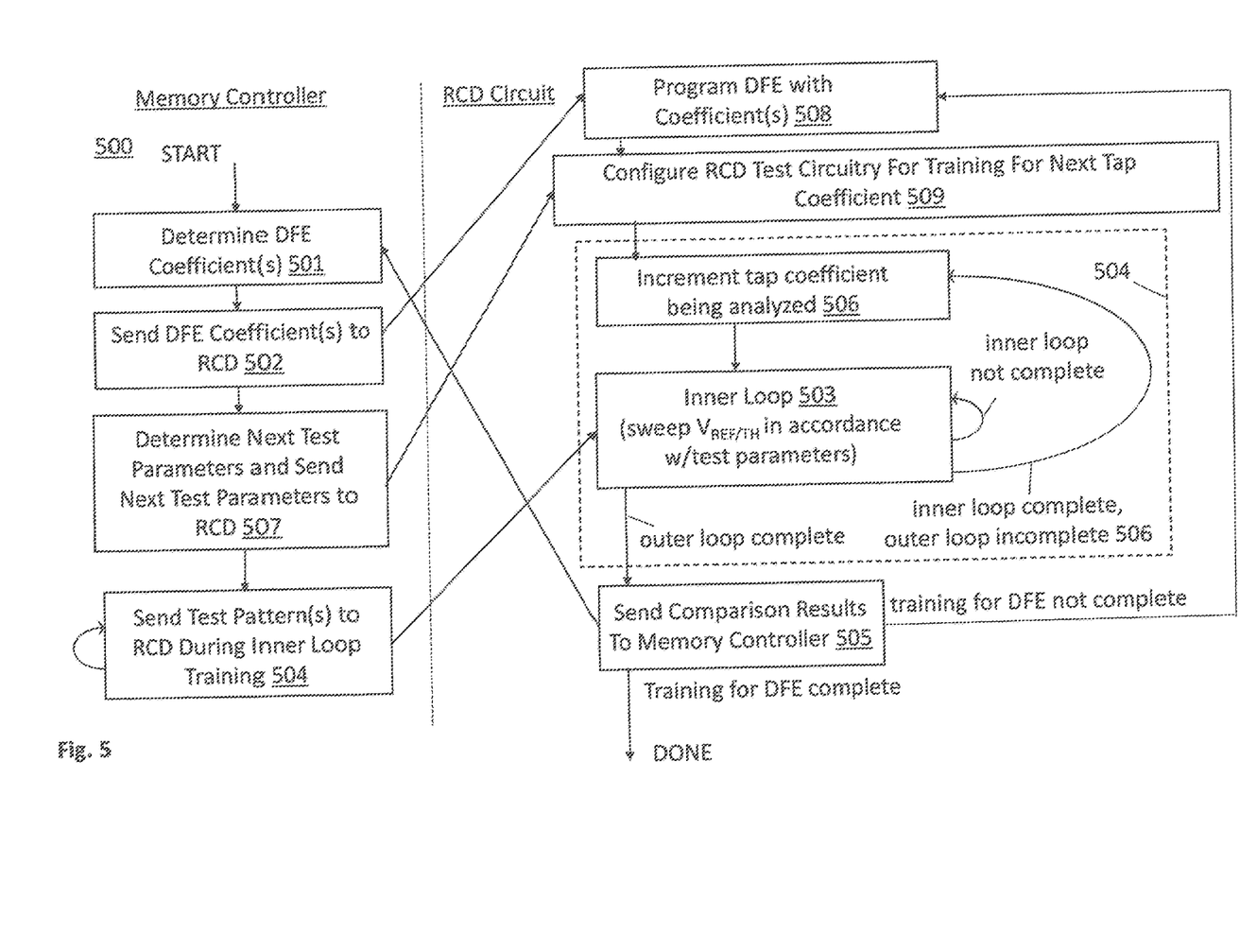
FIG. 5 shows a DFE training process.

FIG. 5 shows an embodiment of a flow diagram 500 of the training sequence. As can be seen from the flow diagram 500, the training sequence involves the cooperation of both the host side memory controller and the RCD circuit. In various implementations, the functions that are performed by the RCD circuit during the training sequence are controlled by the training controller 321 of FIG. 3.

Initially, the host side memory controller determines 501 and sends 502 configuration information for a first round of training tests. As will become more clear in the following discussion, the program flow can be seen as an outer loop 504 in which training is being performed for a particular DFE tap coefficient value, and where, the training entails incrementing the value for the particular DFE tap coefficient on each outer loop iteration 504 so as to affectively "sweep" through a number of different values for the particular DFE tap coefficient. In various embodiments, the memory controller determines 507 the minimum coefficient tap value, the maximum coefficient tap value and the increment that is to be applied to the coefficient tap value on each outer loop iteration. That is, the memory controller determines 507 the values for the coefficient value that are to be swept over by way of the outer loop iterations 504. The RCD receives this information and stores it 509 in the testing configuration register space 322.

Moreover, the memory controller also determines 507 a set of test parameters for an inner loop 503 in which reference and/or threshold voltages for the DFE are swept through. Here, the memory controller determines 507 a minimum reference/threshold voltage, a maximum reference/threshold voltage and an increment to be applied to the reference/threshold voltage with each inner loop iteration 503. That is, the memory controller also determines 507 the values for the DFE reference/threshold voltage that are to be swept over by way of the inner loop iterations 503. The RCD also receives this information and stores it 509 in the testing configuration register space 322.

With the testing parameters for the complete training of a particular coefficient tap value being stored in the RCD's testing register space 322, the RCD circuit's test controller 321 is able to take over responsibility for implementing and overseeing the training for the coefficient tap value. Having the training controlled from the RCD (by way of the test controller 321) is pertinent because it greatly reduces communication/traffic between the RCD and the memory controller as compared to a solution in which the memory controller was responsible for the primary oversight of the training.

Figure 6:
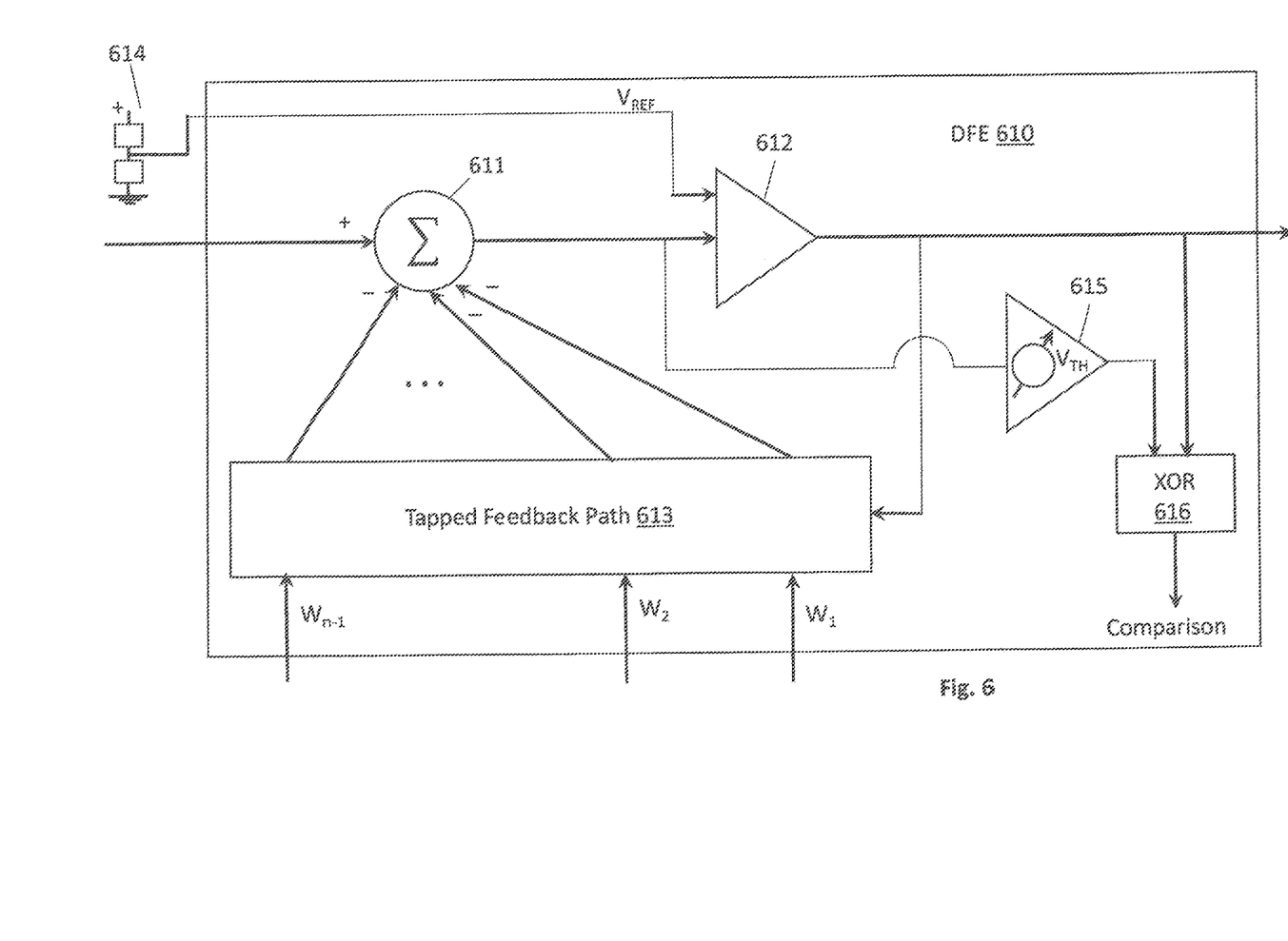
FIG. 6 shows a DFE circuit of the improved registering clock driver circuit of FIG. 3.

FIG. 6 shows a DFE circuit 610 and associated circuitry 614 that is specially designed to support the training exercises that are performed during the outer loop 504 and inner loop 503 training iterations. Here, the feedback path 613 is designed such that its different tap coefficient values ($W_1$, $W_2$, ... $W_{n-1}$) are configurable input parameters (i.e., the respective values for the different tap coefficients can be programmed into the DFE circuit (e.g., by being entered into registers associated with the feedback path)).

Thus, in various embodiment, nominal execution of an outer loop 504 entails configuring the tap coefficient to be trained with a first of its sweep values (e.g., the minimum or maximum value for the tap coefficient's sweep range as just provided by the memory controller), and, setting the reference/threshold voltage to its initial sweep value to setup the inner loop for the first outer loop iteration.

With respect to the inner loop sweep, referring to FIG. 6, a variable voltage divider circuit 614 provides a reference voltage input to the main decision slicer circuit 612. As is known in the art, various signal traces of a memory bus (such as the high speed CA control signal lines of a high performance DDR memory bus) are designed to include a reference voltage $V_{REF}$. In various embodiments, the reference voltage $V_{REF}$ is ideally set midway between a logic high voltage and a logic low voltage that is propagated on the signal line (also referred to as a "trace"). In various embodiments, the variable voltage divider circuit 614 enables the reference voltage $V_{REF}$ on the incoming signal trace to be adjusted and is one of the parameters that can be varied during the inner loop training 503 of the DFE. Here, in various embodiments, the main decision slicer 612 determines whether the input control signal is a logical 1 or 0 by comparing the control signal against the reference voltage.

Additionally, the output of the summation circuit 611 is coupled not only to the main decision slicer 612 of the DFE circuit 601 but also to a second instantiation of the decision slicer 615 that is used during the inner loop training 503. Here, the second decision slicer 615 includes a variable threshold voltage $V_{TH}$. As is known in the art, a decision slicer decides whether an incoming voltage waveform is a 1 or a 0 by comparing the incoming voltage waveform against its internal threshold voltage $V_{TH}$ (if the waveform is greater than the threshold voltage the incoming signal is deemed to be transporting a 1, if the waveform is less than the threshold voltage the incoming signal is deemed to be transporting a 0).

By varying the second slicer's threshold voltage, the voltage height of the "eye pattern" of an incoming test pattern signal can be determined. Specifically, during inner loop training 503, a test pattern signal is sent from the host side (e.g., the system memory controller of the computing system) to the DFE being trained. The signal is processed by the main decision slicer 612 and the second slicer 615. The decisions made by both slicers 612, 615 are then provided to a comparator 616 and compared. If the voltage threshold of the second slicer 615 is raised high enough that it approaches the voltage height of the incoming waveform itself, the second slicer 615 will regularly interpret the waveform incorrectly which will result in a dramatic difference between the output values generated by the main slicer 612 and the second slicer 615 (the comparison of the two outputs by the comparator 616 will result in many differences). At this point, the height of the eye pattern is approximately reached.

Likewise, if the voltage threshold of the second slicer 615 is lowered low enough such that it approaches the voltage floor of the incoming waveform it will also regularly interpret the waveform incorrectly which will result in a dramatic difference between the output values generated by the main slicer 612 and the second slicer 615 (the comparison of the two outputs by the comparator 616 will result in many differences). At this point, the floor of the eye pattern is approximately reached. Thus, the approximate voltage HI and LO voltage levels of the incoming waveform can be measured by adjusting the internal threshold voltage of the second slicer 615.

Thus, referring to FIG. 5, in various embodiments, inner loop training 503 entails sweeping the threshold voltage $V_{TH}$ of the second decision slicer 615 while the outer loop value for the tap coefficient that is being trained is fixed at the current outer loop value. That is, for a single outer loop 504 iteration, the inner loop 503 runs through a number of iterations to sweep the threshold voltage $V_{TH}$. Once the inner loop sweeping 503 is completed, the outer loop 504 advanced to a next iteration 506 and the tap coefficient tap value is incremented 506 to its next sweep value. At this point, training for the new incremented tap value can begin and the inner loop sweeping 503 of the threshold voltage is repeated.

Returning back to a discussion of the execution of the inner loop sweeping 503, once a next $V_{TH}$ value is set for the current inner loop iteration, the host side/memory controller sends a test pattern 504 that includes a sufficient number of sample pulses. The decisions from both slicers 612, 615 are compared by the comparator 616 and the results of the comparison, in one embodiment, are stored in the RCD circuit.

The internal threshold voltage $V_{TH}$ of the second slicer 615 is then adjusted by some increment (e.g., a tenth of a volt, a hundredth of a volt, etc.) away from is prior setting (e.g. the internal threshold voltage is lowered from the prior maximum setting to the maximum setting less the increment) to advance the next iteration of the inner loop 503. The host/memory controller then sends another test pattern 504 and the comparison from both slicer outputs is stored in the RCD. The internal threshold voltage of the second slicer 615 is then further adjusted again by the increment (e.g., the internal voltage is lowered to the maximum setting less two increments), another test pattern 504 is sent and the comparison results are stored in the RCD circuit. The process then repeatedly continues until a full "sweep" of the internal threshold voltage of the second slicer 515 has been achieved (e.g., after a final iteration, the lowering of the internal threshold voltage by the increment causes the internal threshold voltage to reach its minimum voltage) which completes the inner loop 503.

With the completion of the inner loop measurements 503, the RCD circuitry sends 505 the comparison results to the host memory controller. In an alternative implementation, rather than storing the comparison results in the RCD with each inner loop iteration and reporting comparison results only once per outer loop iteration, instead, comparison results are more regularly sent to the memory controller. For example, comparison results are sent with each inner loop iteration or some other interval that is more frequent than once per outer loop iteration (e.g., one feedback signal describing comparison results is sent per N (e.g., 8 unit interval) test patterns sent by the memory controller). Accordingly, with greater feedback frequency, the communication behavior between the RCD and the memory controller is more interactive during test pattern training runtime.

The host memory controller then studies the results and determines 501 the value for particular coefficient tap that the inner loop was executed for (possible other, better estimates for the remaining tap coefficients of the DFE circuit are also determined). The host then sends 502 the newly determined value(s) to the RCD circuit which stores 508 the value(s) in the general configuration register space 323 of the RCD circuit. Going forward, the value stored in the general register space 323 will be used to program the DFE.

With the determined value being entered in general register space 323, the program flow transitions to determining the test configuration for the next outer loop (the next coefficient tap value). The memory controller determines and sends 507 to the RCD circuit the training parameters for the next outer and inner loop sequences (the range and increment for the coefficient tap sweep and the range and increment for the threshold voltage sweep). The RCD circuit then stores 509 these parameters in the RCD's testing configuration register space 322.

The training process then transitions to execution of the outer loop 504 for the new parameter (e.g., the next tap coefficient). In performing the outer loop 504 and its associated inner loop 503, the RCD controller 321 refers to the parameters that were stored in the training configuration space 322 so that RCD controller performs the outer loop tap coefficient sweeps and inner loop $V_{TH}$ sweeps with the respective increments and across the ranges that the memory controller provided 507.

The process then iterates until all coefficient taps for the DFE have been determined. As discussed above, in various embodiments, there is one complete outer loop sweep for each tap coefficient in the DFE. After completion of these outer loop sweeps, a coefficient will have been determined for each feedback path tap and stored in the RCD circuit's general configuration register space 323.

The training process then moves on to a next DFE circuit where the entire process is repeated. After training has been completed for all the DFEs, the DFE training process is complete for the RCD.

It is pertinent to point out that in various embodiments there is one more outer loop sequence performed by the process beyond the number of coefficient taps (e.g., if there are four coefficient taps, five outer loops are performed). Here the inner loop testing for this additional outer loop iteration includes the sending of generic test patterns (e.g., unit interval test patterns) with generic/standard sweep ranges and increments. The comparison data from these sweeps is then sent to the host/memory controller which determines an initial "first stab guess" at the values for each of the coefficient taps in the DFE circuit and sends these coefficients to the RCD. The DFE's coefficients are then programmed 508 with these values.

The next outer loop then corresponds to determination of the first coefficient tap. The inner loop sweeps 503 that are performed for the first coefficient tap are performed with the initial coefficient tap settings being programmed in the DFE. After the completion of the inner loop 503 and the sending of the comparison results 505 to the host/memory controller for analysis, the host/memory controller determines 501 a newly determined first tap coefficient value and sends 502 the newly determined first tap coefficient to the RCD which is programmed 508 into the DFE (and replaces the "first stab guess" value for the first tap coefficient). The newly determined first tap coefficient value is then used by the DFE when the outer loop training for the next, second tap coefficient value is performed. The memory controller also determines and sends 507 a new set of outer and inner loop testing parameters for the next round of outer and inner loop tests (for the second tap coefficient). The RCD stores 509 these values in testing configuration space 322 and then commences the next outer 504 and inner loop testing 503.

In further embodiments, the host side/memory controller not only provides a coefficient value for the first tap at the completion of the inner loop training for the first coefficient tap but also provide new values for the other coefficient taps to replace the "first stab guess" values for these coefficients as well. The set of coefficient values are then programmed into the DFE and used during the outer and inner loop training that is performed for the next, second coefficient tap value. At the completion of this training, the host at least returns a value for the second coefficient tap and may return a new set of coefficient taps for the DFE (e.g., including, possibly, a new coefficient tap value for the first tap). Regardless of how many new coefficient values are determined per completion of an outer loop, after outer loop training has been executed for each of the tap coefficients, the training of the DFE in various embodiments will be complete.

In various embodiments, the line reference voltage $V_{REF}$ may be varied instead of the second slicer threshold voltage $V_{TH}$. In yet other embodiments a deeper inner loop dimension may be attempted where the outer loop sweeps coefficient tap value (as discussed at length above), a first inner loop sweeps one of $V_{TH}$ and $V_{REF}$ and a second, deeper inner loop sweeps the other of $V_{TH}$ and $V_{REF}$. Here, increment of the first inner loop voltage does not occur until the deepest (second) inner loop voltage has been fully swept.

In various embodiments, inner loop training can be performed in a manner that does not sweep any adjustable reference voltages. Here, for instance, the host may specify a NULL value for a particular sweep's range and increment. In cases where a NULL is provided for the sweeps of both reference voltages, the host may vary another parameter of the memory bus such as, e.g., the frequency or temporal position (phase) of the clock that the incoming signal that the DFE determines the value of is timed according to. Here, again, when the comparison information from both slicers is dramatically different, the frequency/phase of the clock will be understood to be at a value for signal interpretation is unreliable.

Figure 7:
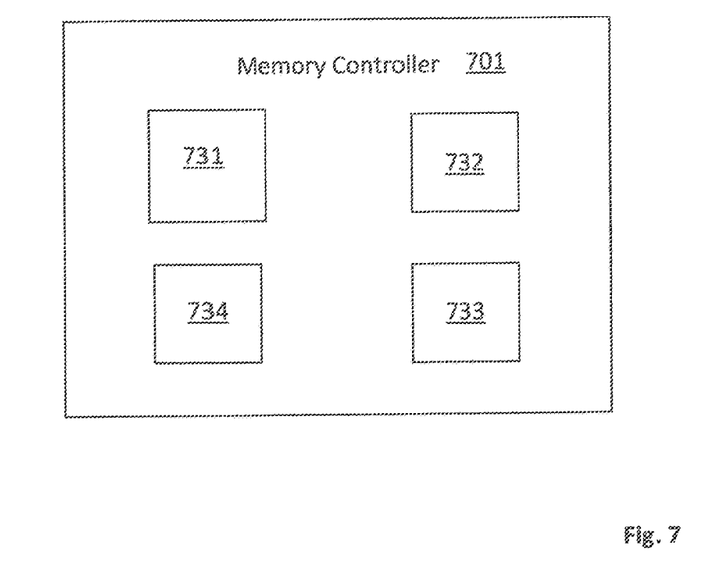
FIG. 7 shows an improved memory controller.

FIG. 7 shows an embodiment of a memory controller 701 that can perform the DFE training process of FIG. 5 in cooperation with the improved RCD circuit 306 of FIG. 3. As observed in FIG. 7, the memory controller 701 includes a training controller 731 to oversee and control the memory controller's operations during the training. The memory controller also includes DFE tap determination intelligence 732 and sweep determination intelligence 733. The DFE tap determination intelligence 732 is circuitry that determines, e.g., one or more DFE tap coefficient values in view of comparison results that were provided by the RCD after training. The sweep determination intelligence 733 determines ranges and increments for both line reference voltage $V_{REF}$ and second slicer internal threshold voltage $V_{TH}$ sweeps.

The training controller 731 may be implemented with any combination of dedicated logic circuitry (such as state machine logic circuitry that implements a control state machine for the training) or logic circuitry that executes some form of program code (e.g., an embedded controller or processor that executes training firmware) to perform the control functions for the training performed by the memory controller 701. The DFE tap and sweep determination intelligence 732, 733 may likewise be implemented with any combination of look-up table circuitry (e.g., embedded memory) and/or dedicated logic and/or program code execution logic to look-up and/or explicitly calculate DFE tap coefficients and appropriate sweep parameters. The memory controller also includes test pattern generation logic 734 to generate the test patterns that are used to determine the DFE tap coefficients.

Referring back to FIG. 3, the training controller 321 of the RCD circuit 306 may also be implemented with any combination of dedicated logic circuitry (such as state machine logic circuitry that implements a control state machine for the training) or logic circuitry that executes some form of program code (e.g., an embedded controller or processor that executes training firmware) to perform the control functions for the training performed by the RCD. The training controller 321 is coupled to feedback path circuitry of the DFEs to set tap coefficient values. Likewise, the training controller 321 is also coupled to the adjustable reference voltage circuitry 614 and the threshold circuitry of the second slicer 615 to implement respective sweeps of the line reference voltage $V_{REF}$ and/or the internal threshold voltage $V_{TH}$.

In various embodiments the control signals that are received with DFE circuits that are trained according to the procedures describe above, and the memory controller and RCD circuit that perform the training, are each compatible with the specifications of a published industry standard such as a Joint Electron Device Engineering Council (JEDEC) DDR memory bus standard (e.g., a DDR5 JEDEC standard).

Figure 8:
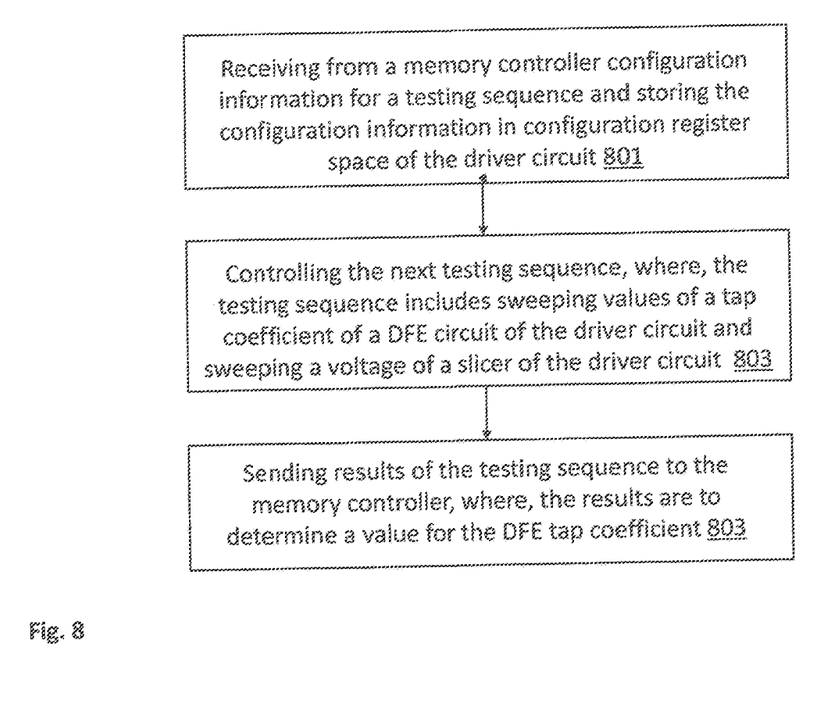
FIG. 8 shows a method performed by the improver registering clock driver circuit of FIG. 3.

FIG. 8 shows a method performed by a driver circuit as described above. The method includes receiving from a memory controller configuration information for a testing sequence and storing the configuration information in configuration register space of the driver circuit 801. The method also includes controlling the testing sequence, where, the testing sequence includes sweeping values of a tap coefficient of a DFE circuit of the driver circuit and sweeping a voltage of a slicer of the driver circuit 802. The method also includes sending results of the testing sequence to the memory controller, where, the results are to determine a value for the DFE tap coefficient 803.

Figure 9:
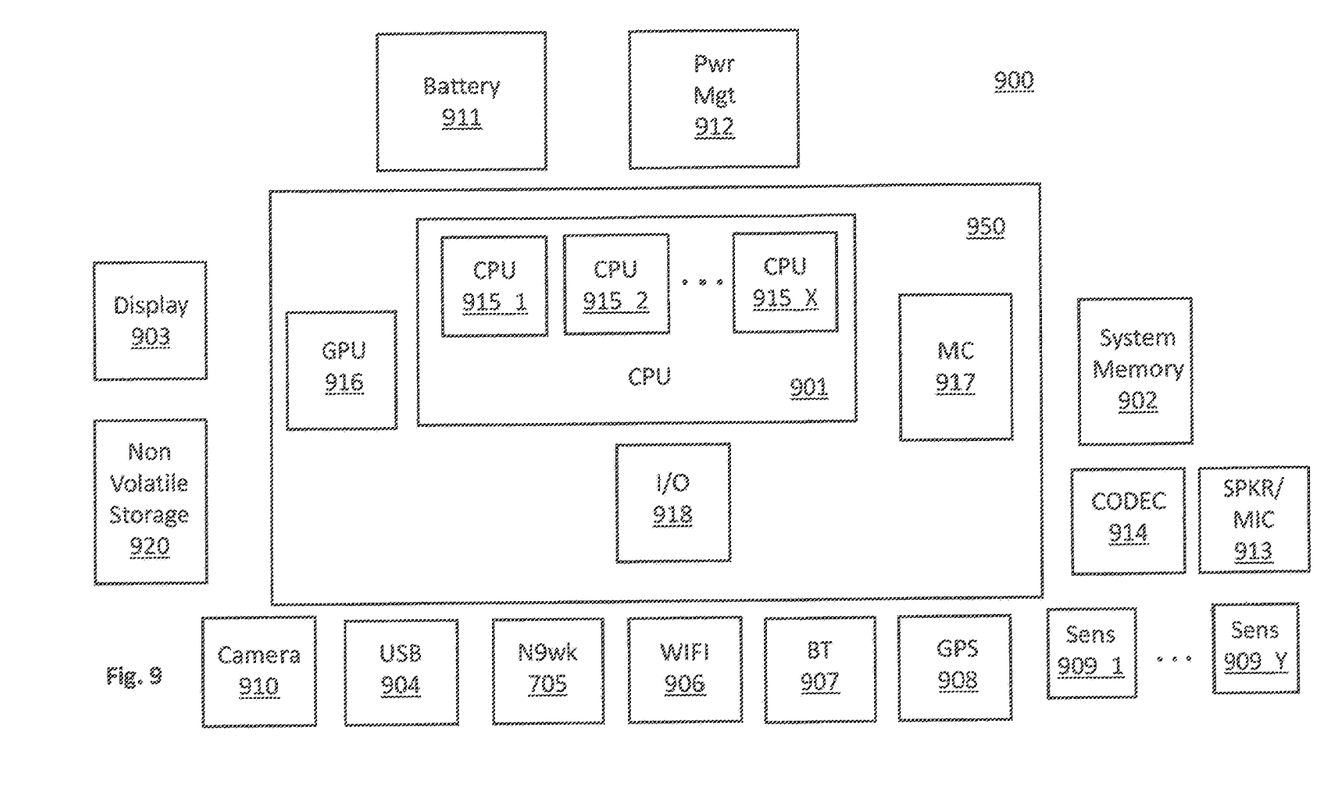
FIG. 9 shows a computing system.

FIG. 9 provides an exemplary depiction of a computing system 900 (e.g., a smartphone, a tablet computer, a laptop computer, a desktop computer, a server computer, etc.). As observed in FIG. 9, the basic computing system 900 may include a central processing unit 901 (which may include, e.g., a plurality of general purpose processing cores 915_1 through 915_X) and a main memory controller 917 disposed on a multi-core processor or applications processor, system memory 902, a display 903 (e.g., touchscreen, flat-panel), a local wired point-to-point link (e.g., USB) interface 904, various network I/O functions 905 (such as an Ethernet interface and/or cellular modem subsystem), a wireless local area network (e.g., WiFi) interface 906, a wireless point-to-point link (e.g., Bluetooth) interface 907 and a Global Positioning System interface 908, various sensors 909_1 through 909_Y, one or more cameras 910, a battery 911, a power management control unit 912, a speaker and microphone 913 and an audio coder/decoder 914.

An applications processor or multi-core processor 950 may include one or more general purpose processing cores 915 within its CPU 901, one or more graphical processing units 916, a memory management function 917 (e.g., a memory controller) and an I/O control function 918. The general purpose processing cores 915 typically execute the operating system and application software of the computing system. The graphics processing unit 916 typically executes graphics intensive functions to, e.g., generate graphics information that is presented on the display 903. The memory control function 917 interfaces with the system memory 902 to write/read data to/from system memory 902. The power management control unit 912 generally controls the power consumption of the system 900.

Each of the touchscreen display 903, the communication interfaces 904-707, the GPS interface 908, the sensors 909, the camera(s) 910, and the speaker/microphone codec 913, 914 all can be viewed as various forms of I/O (input and/or output) relative to the overall computing system including, where appropriate, an integrated peripheral device as well (e.g., the one or more cameras 910). Depending on implementation, various ones of these I/O components may be integrated on the applications processor/multi-core processor 950 or may be located off the die or outside the package of the applications processor/multi-core processor 950.

The computing system may also include a memory system, such as system memory (also referred to as main memory) implemented with a memory controller and RCD circuitry that cooperatively perform DFE training for memory bus control signals as described at length above. Here, operations of the testing procedure may, e.g., be stored in non volatile memory or storage as firmware program code of the computing system. The firmware is loaded into the memory controller and/or RCD during boot-up of the computing system.

Application software, operating system software, device driver software and/or firmware executing on a general purpose CPU core (or other functional block having an instruction execution pipeline to execute program code) of an applications processor or other processor may perform any of the functions described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
a registering clock driver (RCD) circuit comprising a decision feedback equalizer (DFE) circuit, the DFE circuit comprising programmable DFE feedback tap coefficients, the DFE circuit comprising a programmable reference voltage, the DFE circuit comprising a decision circuit that determines a logical value of a signal based on the programmable reference voltage, the RCD circuit further comprising DFE training circuitry to support a training sequence that determines appropriate values for the feedback tap coefficients, the DFE training circuitry comprising:
a) test controller circuitry to conduct inner test loops that sweep the reference voltage and outer test loops that sweep a particular one of the DFE feedback coefficient values, wherein, a next outer test loop is executed after all of the inner test loops have been executed, wherein the RCD circuit is to receive a test pattern from a host in between inner test loop iterations, the DFE training circuitry to cause the RCD to send test results to the host so that the host is able to determine an acceptable value for the particular one of the DFE feedback coefficient values;
b) register space to store an inner test loop reference voltage increment received from the host and an outer test loop DFE feedback coefficient value increment received from the host, the test controller circuitry to increment the reference voltage by the inner test loop reference voltage with each next inner test loop iteration, the test controller circuitry to increment the particular one of the DFE feedback coefficient values by the outer test loop DFE feedback coefficient value increment with each next outer test loop iteration.

2. The apparatus of claim 1 wherein the DFE training circuitry comprises an exclusive OR (XOR) circuit to compare a test pattern against DFE decisions made against the test pattern.

3. The apparatus of claim 2 wherein the test results are generated by the XOR circuit.

4. The apparatus of claim 1 wherein the RCD circuit is disposed on a memory module.

5. The apparatus of claim 4 wherein the memory module is plugged into a computer system.

6. A memory controller, comprising:
a dual data rate (DDR) memory interface to interface with a registering clock driver (RCD) circuit, the RCD circuit comprising a decision feedback equalizer (DFE) circuit, the DFE circuit comprising programmable DFE feedback tap coefficients, the DFE circuit comprising a programmable reference voltage, the DFE circuit comprising a decision circuit that determines a logical value of a signal based on the programmable reference voltage, the RCD circuit further comprising DFE training circuitry to support a training sequence that determines appropriate values for the feedback tap coefficients, the memory controller comprising:
circuitry to establish inner test loops performed by the RCD circuit that sweep the reference voltage and outer test loops performed by the RCD circuit that sweep a particular one of the DFE feedback coefficient values, wherein, a next outer test loop is executed after all of the inner test loops have been executed, the memory controller to receive test results from the RCD circuit and determine an acceptable value for the particular one of the DFE feedback coefficient values therefrom, the circuitry to determine an inner test loop reference voltage increment and an outer test loop DFE feedback coefficient value increment and to cause the inner test loop reference voltage increment and the outer test loop DFE feedback coefficient value increment to the RCD circuit for implementation by the RCD circuit;
test pattern determination circuitry, the memory controller to send a test pattern determined by the test pattern determination circuitry to the RCD circuit in between inner test loop iterations.

7. The memory controller of claim 6 wherein the memory controller is within a computing system.

\* \* \* \* \*